(12) United States Patent
Eyckmans et al.

(10) Patent No.: US 7,859,349 B2
(45) Date of Patent: Dec. 28, 2010

(54) FULLY INTEGRATED TUNEABLE SPIN TORQUE DEVICE FOR GENERATING AN OSCILLATING SIGNAL AND METHOD FOR TUNING SUCH APPARATUS

(75) Inventors: Wouter Eyckmans, Wilrijk (BE); Liesbet Lagae, Herent (BE)

(73) Assignee: IMEC, Leuven (BE)

( * ) Notice: Subject to any disclaimer, the term of this patent is extended or adjusted under 35 U.S.C. 154(b) by 843 days.

(21) Appl. No.: 10/584,700

(22) PCT Filed: Dec. 24, 2004

(86) PCT No.: PCT/EP2004/014816

§ 371 (c)(1),
(2), (4) Date: May 10, 2007

(87) PCT Pub. No.: WO2005/064783

PCT Pub. Date: Jul. 14, 2005

(65) Prior Publication Data

US 2007/0285184 A1    Dec. 13, 2007

Related U.S. Application Data

(60) Provisional application No. 60/533,323, filed on Dec. 29, 2003.

(30) Foreign Application Priority Data

Dec. 24, 2003    (EP) .................................. 03447312

(51) Int. Cl.
*H01S 1/00*    (2006.01)
*H03B 28/00*    (2006.01)

(52) U.S. Cl. .................. 331/94.1; 331/177 R; 331/187; 257/421

(58) Field of Classification Search .................. 331/86, 331/89, 107 DP, 107 SL, 177 R, 187, 94.1; 257/421; 324/237; 428/212
See application file for complete search history.

(56) References Cited

U.S. PATENT DOCUMENTS 4,078,186 A    3/1978    Folen et al.
(Continued)

FOREIGN PATENT DOCUMENTS

GB    1481591    8/1977
(Continued)

OTHER PUBLICATIONS

Lagae, et al., "On-chip manipulation and magnetization assessment of magnetic bead ensembles by integrated spin-valve sensors", May 15, 2002, Journal of Applied Physics, vol. 91, No. 10, pp. 7445-7447.*

(Continued)

*Primary Examiner*—Robert Pascal
*Assistant Examiner*—Ryan Johnson
(74) *Attorney, Agent, or Firm*—McDonnell Boehnen Hulbert & Berghoff LLP

(57) ABSTRACT

The present invention is related to a device and corresponding methods for generating an oscillating signal. The device comprises a means for providing a current of spin polarised charge carriers, a magnetic, e.g. ferromagnetic, excitable layer adapted for receiving the generated current of spin polarised charge carriers thus generating an oscillating signal with a frequency $V_{osc}$ and an integrated means for interacting with said magnetic, e.g. ferromagnetic, excitable layer such that a selection of said oscillation frequency is achieved. No external field needs to be applied to select or tune the frequency. Different types of integrated means can be used, such as e.g. means inducing mechanical stress in the magnetic, e.g. ferromagnetic, excitable layer, means inducing exchange bias interactions and means inducing magnetostatic interactions.

31 Claims, 7 Drawing Sheets

U.S. PATENT DOCUMENTS

| | | | |
|---|---|---|---|
| 4,103,339 A | 7/1978 | Hubbell et al. | |
| 4,604,669 A | 8/1986 | Ballinger et al. | |
| 4,968,954 A | 11/1990 | Ryuo et al. | |
| 5,057,800 A | 10/1991 | Hanna | |
| 5,129,262 A | 7/1992 | White et al. | |
| 5,260,615 A | 11/1993 | Sahashi et al. | |
| 5,959,388 A | 9/1999 | Graebner et al. | |
| 7,259,545 B2 * | 8/2007 | Stauth et al. | 324/117 R |
| 2005/0023938 A1 * | 2/2005 | Sato et al. | 310/363 |

FOREIGN PATENT DOCUMENTS

| | | |
|---|---|---|
| JP | 08237058 | 9/1996 |
| SU | 633072 | 11/1978 |

PUBLICATIONS

Kiselev et al., "Microwave Oscillations of a Nanomagnet Driven by a Spin-Polarized Current", Nature, Sep. 25, 2003, pp. 380-383:425.

Rippard et al., "Direct-Current Induced Dynamics in Co90Fe10/Ni80Fe20 Point Contacts", Phys. Rev. Lett., Jan. 15, 2004, pp. 027201-1-027201-4:92(2).

Maksymowicz et al., "Coupling Interaction and Surface Energy in FEBSI/SI and FEBSI/PT Multilayered Structures," Thin Solid Films, Elsevier-Sequoia S.A. Lausanne, vol. 191(2):201-210 (1990).

European Search Report for Application No. EP03447312 dated Jul. 15, 2004.

* cited by examiner

MOKE MEASUREMENT OF AF BIASED FIXED LAYER
TJ - Ni - PZT
--- NO VOLTAGE
— 200V TOP ELECTRODE

FULLY INTEGRATED TUNEABLE SPIN TORQUE DEVICE FOR GENERATING AN OSCILLATING SIGNAL AND METHOD FOR TUNING SUCH APPARATUS

TECHNICAL FIELD OF THE INVENTION

The present invention relates to devices and corresponding methods for generating oscillating signals such as e.g., but not limited to, current induced oscillators, modulators and filters, which are based on the 'spin torque' effect.

BACKGROUND OF THE INVENTION

Modern RF front ends in portable wireless devices, such as portable wireless communication devices, require minimal size, stable, wideband tuneable oscillators with low operating power and high output power. The frequencies used in commercial systems today are synthesized from off-chip passive resonators, e.g. quartz crystals, with a very high-quality resonance at low frequencies (10-30 MHz). The quality of the oscillation is typically represented by its quality factor Q defined by the ratio of the peak frequency of the oscillation peak to the width of the oscillation peak at half of the maximum amplitude. In FIG. 1 the relation between the oscillation peak and the quality factor Q is shown. This typically is about 10000 for quartz oscillators. Such oscillators have lateral dimensions on the order of 1 or 2 mm. Integrated oscillators on the other hand, which may e.g. consist of an LC-tank circuit or a miniaturized integrated resonators (RF-MEMS) typically have a much lower quality factor. For integrated oscillators consisting of an LC-tank circuit the quality factor Q typically is smaller than 100, whereas for miniaturized integrated mechanical resonators a quality factor larger than 1000 can be obtained at high frequencies (500 MHz-6 GHz). Nevertheless, the latter require complicated fabrication steps and it is difficult to tune their frequency.

Some applications of the spin torque effect are known. Some aspects of the spin torque effect have been predicted and described in 1996 in for instance patent U.S. Pat. No. 5,659,864. Demonstrations of spin torque have so far been focused on 'current-induced switching' for application in Magnetic Random Access Memories. Some examples of the use of spin torque effects are listed below. In S. I. Kiselev et al., Nature 425, 380 (2003), the spin torque effect is studied in a basic structure being a multilayer of 80 nm Cu/40 nm Co/10 nm Cu/3 nm Co/2 nm Cu/30 nm Pt patterned into a nanopillar (elliptical cross section of 130 nm×70 nm) and contacted with a Cu top contact. The 40 nm Co layer acts as the fixed layer, the 10 nm Cu layer is the interlayer and 3 nm Co layer is the excitable layer. The nanopillar embodiment allows to obtain a confined spin polarised charge carrier current.

In W. H. Rippard et al. PRL 92, 027201 (2004), the spin torque effect is studied in a basic structure being a CoFe/Cu/NiFe trilayer that was contacted by patterning a nanohole (diameter 40-100 nm) in the isolator on top. Oscillations were obtained with a frequency that was tuneable between 5 and 35 GHz, depending on the value of the external magnetic field. The modes of most interest are those with very high Q-factor oscillations. The largest observed Q of 18000 was obtained in a nanohole for a magnetic field of 1 T applied at an angle of 30° from the surface and a current of 6 mA, resulting in a frequency of 35.4 GHz. Reasonably high quality factors, but with higher output powers, could be reached at low magnetic fields, e.g. Q=2705 at 0.15 T applied at 85° to the surface, corresponding to a frequency of 9.69 GHz. FIG. 2a illustrates the frequency spectrum of the AC voltage measured over a trilayer contacted through a 40 nm nanohole when a current of 6 mA is sent through and an external field H of 0.15 T is applied at an angle of 85 degrees from the surface, as indicated in the inset. The peak frequency can be set by the external magnetic field in a broad range of 5-35 GHz and with a slope of 26.2 GHz per Tesla as seen in FIG. 2b. The current can also be used to set and control the frequency with a slope of −0.23 GHz per mA, as shown in FIG. 2c.

Some basic geometries that are used in the state-of-the-art geometries of the current induced oscillator tunable by an external magnetic bias field H, are shown by the devices 100 in FIG. 3. The external magnetic bias field H might be oriented along any direction. Two typical examples, i.e. the nanopillar embodiment and the nanohole embodiment, both allowing confinement of the current, are illustrated in FIG. 3. The diameter of the nanopillar or nanohole is typically small to guarantee a high degree of confinement of the DC current. The systems comprise a so-called trilayer, which exists of a ferromagnetic exitable layer 102, an interlayer 110 and a fixed layer 112. This trilayer might be patterned into a nanopillar or contacted through a nanohole to confine the current and increase the spin torque exerted on the excitable layer. Current is applied through electrodes 116.

The external, i.e. not integrated or united, electromagnet that is currently used requires external not-integrated components. This makes the device large in size, heavy and unpractical.

There is a need to provide fully integrated RF circuits, in which all essential elements for selecting a frequency or tuning a frequency of the oscillations are present in a united way, i.e. structurally or functionally, and which furthermore are able to set or tune the peak frequency of the oscillation while keeping the quality factor and the stability of the oscillation maximal, i.e. as high as possible, and with minimal additional power consumption.

SUMMARY OF THE INVENTION

It is an object of the present invention to provide devices and methods which solve at least some of the problems of the prior art. At least one of these problems is:

integration of the components to obtain compact devices, obtaining tunability combined with keeping the quality factor and the stability of the oscillation maximal and with keeping minimal additional power consumption.

It is also an object of the present invention to provide novel methods and corresponding devices for setting the frequency of a current induced oscillator with high controllability.

It is furthermore an object of the present invention to provide alternative read out schemes for an oscillator.

The above objectives are accomplished by a method and device according to the present invention.

The invention relates to a device for generating an oscillating signal, the device comprising a means for providing a current of spin polarised charge carriers, a magnetic excitable layer adapted for receiving said current of spin polarised charge carriers thus generating an oscillating signal with a frequency $v_{osc}$ and an integrated means for interacting with said magnetic excitable layer such that a selection of said oscillation frequency is achieved. The magnetic excitable layer may be a ferromagnetic excitable layer. Said integrated means for interacting with said magnetic excitable layer such that a selection of said oscillation frequency is achieved may be a means for controllably tunable interacting with said magnetic excitable layer such that a controllable tuning of said oscillation frequency is achieved. Said interacting may comprise performing magnetic interactions comprising inducing mechanical stress in said magnetic excitable layer. Said magnetic interactions may be interface interactions. Said surface interactions may comprise exchange bias interactions. Said interacting may comprise performing magnetostatic interactions. Said magnetic excitable layer may be a ferromagnetic semiconductor layer and said interacting may comprise applying an electric field over said ferromagnetic semiconductor layer. Said device may comprising a means for generating a magnetic bias field to bias the magnetic excitable layer. Said means for generating a magnetic bias field may be an anti ferromagnetic layer which is in at least partial magnetic contact with said magnetic excitable layer. The device may comprise a means for generating stress upon said anti ferromagnetic layer. The means for generating said magnetic bias field may comprise an element of ferromagnetic material which is magnetostatically coupled to said magnetic excitable layer. The device may comprise a means for changing the geometric distances between said magnetic excitable layer and said ferromagnetic element. The means for changing the geometric distances may consist of a piezoelectric layer or suspended structure. The means for changing the geometric distances may e.g. comprise a cantilever structure. Said integrated means for interacting with said magnetic excitable layer may comprise an interacting layer, which is coupled magneto-elastically and/or magneto-statically and/or via the exchange bias effect to said magnetic excitable layer. Said interacting layer may be a piezoelectric layer and/or an antiferromagnetic layer. The device furthermore may comprise a surface acoustic wave generating means which can generate a Surface Acoustic Wave in said interacting layer. Said interacting layer may be a structural part of the Surface Acoustic Wave generating means. Said Surface Acoustic Wave generating means may generate a Surface Acoustic Wave in said interacting layer, which has a frequency essentially equal to the magnetic resonance frequency of said excitable layer, or an integer multiple thereof. At least 2 electrodes may be provided on a surface of or inside said interaction layer, which allow to induce stress in said interaction layer by putting an electrical potential difference over them. The device may comprise a means for generating stress in said interaction layer by physical force or pressure build up. The means for providing a current of spin polarised charge carriers may be abutting on said magnetic excitable layer and may comprise an electrode, a spin polarisation means and a current confinement structure. The means for providing a current of spin polarised charge carriers may comprise a fixed layer with a constant magnetic polarisation through which the current is passing, before entering into the excitable layer. The fixed layer and excitable layer may be separated by an interlayer to magnetically separate both layers. The device may comprise a readout structure, which measures the excitation caused by the spin polarised current passing through said magnetically excitable layer or a related or equivalent parameter. The device may comprise a readout structure, which measures the magneto-resistance or a related effect, generated by combination of the fixed layer and the magnetic excitable layer. The device may comprise a readout structure, which comprises a piezoelectric measurement layer, which converts the precessional movement of the excitable layer into an electrical signal. The device also may comprise a readout structure, which measures the resistance change by measuring the AC signal between at least 2 electrodes in electrical contact with said excitable layer. The device may comprise a readout structure, which measures the change of resistance or voltage in a lateral geometry.

The invention also relates to a method for generating oscillations, the method comprising providing a current of spin polarised charge carriers, thus generating an oscillating signal with an oscillation frequency $v_{osc}$ by interaction between said current of spin polarised charge carriers and a magnetic excitable layer and controllably tuning said oscillation frequency $v_{osc}$ by inducing an interaction between an integrated means and said magnetic excitable layer. The magnetic excitable layer may be a ferromagnetic excitable layer. Inducing an interaction between an integrated means and said magnetic excitable layer may comprise any of inducing mechanical stress in said magnetic excitable layer, inducing exchange bias interactions and inducing magnetostatic interactions. Said magnetic excitable layer may be a ferromagnetic semiconductor layer, and inducing an interaction may be performed by applying an electric field over said ferromagnetic semiconductor layer. Said inducing exchange bias interactions may comprise generating a magnetic bias field to bias the excitable layer. Generating a magnetic bias field may comprise generating stress upon an anti ferromagnetic layer in magnetic contact with said magnetic excitable layer. Inducing an interaction may comprise bringing a ferromagnetic element in contact with the magnetic excitable layer and changing the geometric distance between said element and said layer. Inducing an interaction may comprise generating a surface acoustic wave in an interacting layer provided in the neighbourhood of the magnetic excitable layer, wherein the surface acoustic wave has a frequency that is substantially equal to the magnetic resonance frequency of said excitable layer, or an integer multiple thereof. Inducing an interaction may comprise generating stress in an interacting layer in direct or indirect contact with the magnetic excitable layer. Said generating stress may be performed by applying an electric field to said interacting layer, said interacting layer e.g. being a piezoelectric layer. Said generating stress may be performed by exerting physical force or pressure on said interaction layer. Said providing a current of spin polarised charge carriers may comprise providing a confined current of spin polarised charge carriers.

The invention also relates to a method for reading out a magnetic element, the method comprising providing a current of spin polarised charge carriers, thus generating an oscillating signal with an oscillation frequency $v_{osc}$ by interaction between said current of spin polarised charge carriers and a magnetic excitable layer, controllably tuning said oscillation frequency $v_{osc}$ by inducing an interaction between an integrated means and said magnetic excitable layer and measuring an excitation, or a related or equivalent parameter, said excitation being caused by said spin polarised charge carriers. The magnetic excitable layer may be a ferromagnetic excitable layer. Measuring an excitation or a related or equivalent parameter caused by said spin polarised charge carriers may comprise converting the precessional movement of the excitable layer into an electrical signal. Measuring an excitation or a related or equivalent parameter caused by said spin polarised charge carriers may comprise measuring a resistance change by measuring an AC signal between at least 2 electrodes in electrical contact with said magnetic excitable layer. Measuring an excitation or a related or equivalent parameter caused by said spin polarised charge carriers may comprise measuring the change of resistance or voltage in a lateral geometry.

It is advantageous that the present invention is based on the spin torque effect. This effect refers to the effect whereby a torque is exerted by a spin-polarized current of charge carriers, e.g. an electron flow, on a thin magnetic excitable layer. The spin-polarized current creates a stable magnetic precession by a torque that counteracts the intrinsic damping of magnetic motion of the excitable layer. The current can thus generate high-quality microwave oscillations. Such devices can for instance, but not only, be used as an RF oscillator, clock, modulator in e.g. microwave transceivers and integrated RF circuits.

It is also an advantage of the present invention to provide a means that can controllably alter the frequency by indirect interaction with the excitable layer through a means for generating the magnetic bias field.

The present invention provides methods of biasing and tuning a spin torque oscillator by providing an integrated means for tunable interacting directly or indirectly with the excitable layer through magnetic interactions such as magneto-elastic and/or magneto-static couplings and/or exchange bias effects.

For the purpose of the present invention, the term "magnetostatic coupling" comprises the mutual influence of magnetic materials when placed close to each other and is further defined by the state of the art. The energy associated with this coupling is called "magnetostatic energy".

For the purpose of the present invention, the term "magnetoelastic coupling" relates to the effect whereby strain and stress in a ferromagnetic material changes the magnetocrystalline anisotropy and may thereby influence the magnetization state. The coupling effects of stress and strain (coupled by Young's modulus) in a material and its magnetic properties are often called and comprised in the term "magneto-elastic coupling" and the energy associated with this effect is called the "magnetoelastic energy".

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The teachings of the present invention permit the design of improved methods and apparatus for generating oscillating signals in compact devices.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 2*a* is a graph of the power as a function of the frequency, FIG. 2*b* indicates the tunability of the peak frequency as a function of the external magnetic field and FIG. 2*c* indicates the peak frequency as a function of the DC current used in the system.

FIG. 6*a* illustrates alternative configurations of an embodiment with an interacting layer being an anti-ferromagnetic material in direct contact with the magnetic excitable layer, FIG. 6*b* illustrates an embodiment with an interacting layer being a ferromagnetic material in magnetic contact with the magnetic excitable layer.

FIG. 14*a* illustrates a side view, FIG. 14*b

DESCRIPTION OF ILLUSTRATIVE EMBODIMENTS

Figure 1:
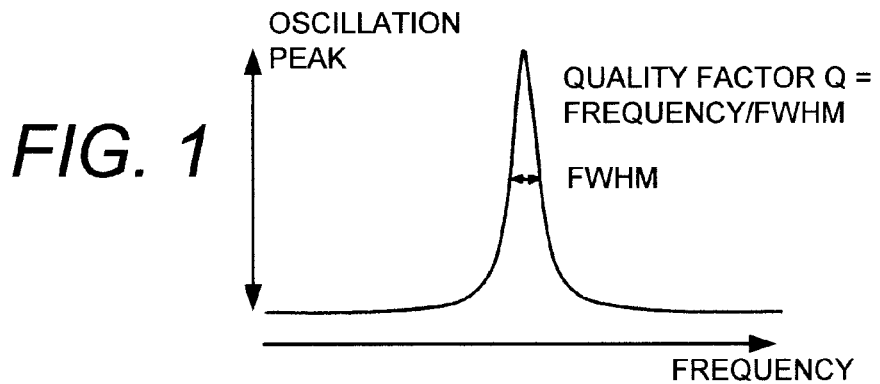
FIG. 1 illustrates the relation between the quality factor Q and the oscillation peak obtained in a device for generating oscillations, as known.
Figure 2A:
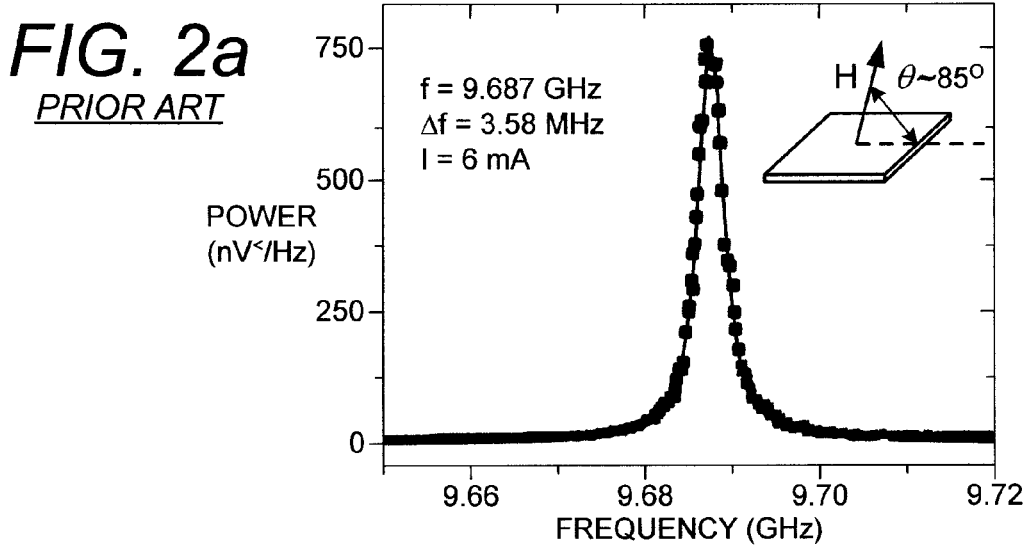
FIG. 2*a* —prior art to FIG. 2*c* prior art shows microwave oscillation with a high quality factor Q in a system known from the prior art.
Figure 2B:
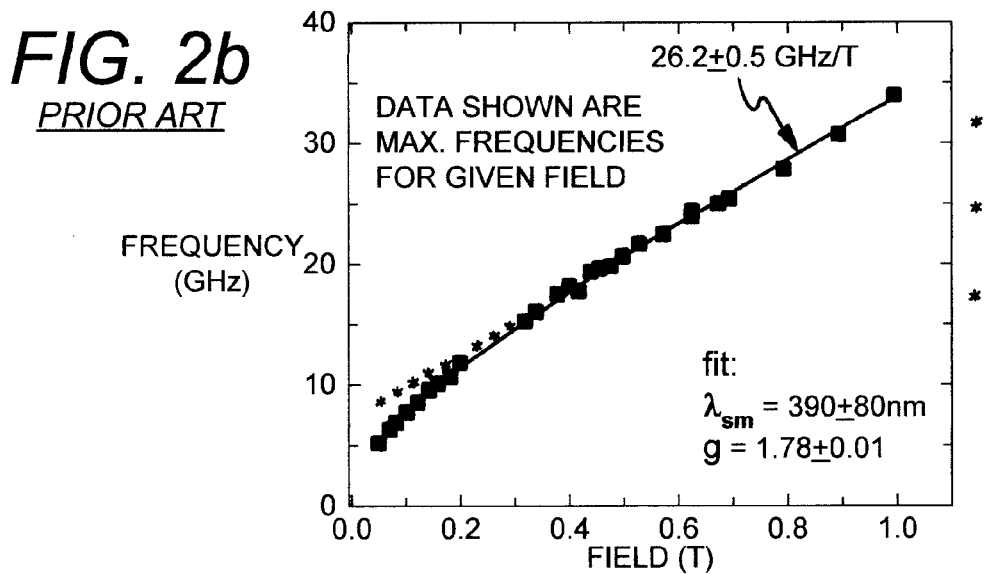
Figure 2C:
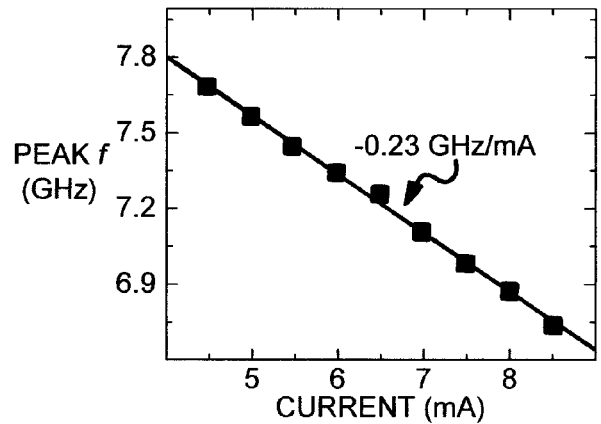
Figure 3:
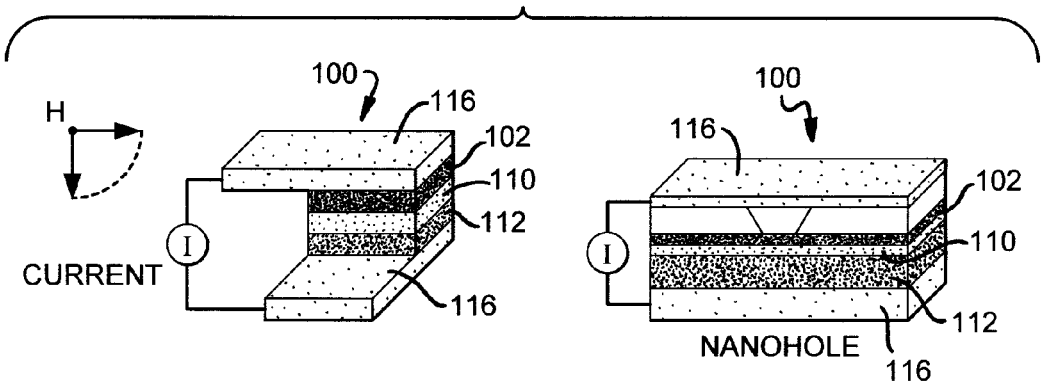
FIG. 3—prior art shows basic geometries as currently used in current induced oscillators known from the prior art. Both a nanopillar patterned trilayer and a system for contacting through a nanohole are illustrated.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

Figure 4:
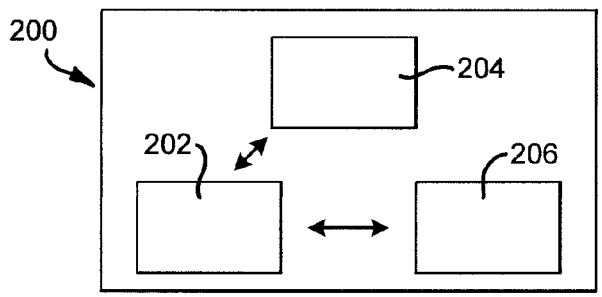
FIG. 4 shows a schematic diagram of the different components of an electronic device for generating oscillations with a selectable frequency according to the first embodiment of the present invention.

In a first embodiment, the present invention relates to an electronic device 200, also referred to as a tuneable current-induced oscillator, comprising a magnetic excitable layer 202, e.g. ferromagnetic excitable layer 202, a means for providing a current of spin polarised charge carriers 204 into the excitable layer 202 such that oscillations are generated in the ferromagnetic excitable layer 202 with a frequency $v_{osc}$ and a means for interaction 206 with the ferromagnetic excitable layer as to select a frequency of the generated oscillations. See FIG. 4. For clarity reasons in the following a ferromagnetic excitable layer 202 will be discussed further, although the invention is not limited to ferromagnetic excitable layers but refers to all magnetic excitable layers. In a preferred embodiment the means for interaction 206 with the ferromagnetic excitable layer as to select a frequency of the generated oscillations may be a means for interaction 206 with the ferromagnetic excitable layer as to tune a frequency of the generated oscillations. The latter implies that the frequency can not only be selected during designing or production of the device but that the frequency also can be selected during use, i.e. that the frequency can be tuned during use. A schematic representation of the different components of the device 200 and the interaction between the different components is illustrated in FIG. 4. It is an advantage of the embodiments of the present invention that novel methods and corresponding devices are provided for setting the frequency of a current induced oscillator with high controllability.

Figure 5:
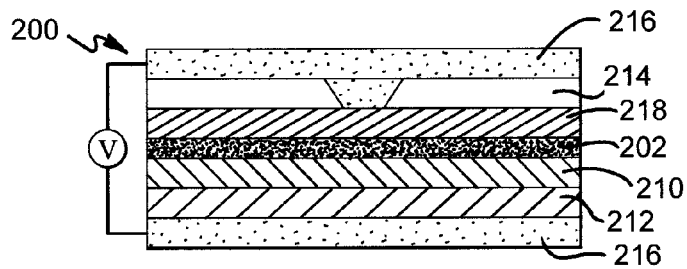
FIG. 5 shows a schematic representation of an integrated structure for an electronic device for generating oscillation with a selectable frequency according to the first embodiment of the present invention.

The excitable ferromagnetic layer 202 may be a thin ferromagnetic film of any alloy of Co, Fe, Ni, or another ferromagnetic metal or a semiconductor with ferromagnetic properties such as Mn-doped GaAs or Cr doped GaN, AlN, etc . . . The means for providing a current of spin polarised charge carriers 204 may be any means for providing such a current which allows to obtain a high spin polarised charge carriers density. An example of such a means may be a trilayer, existing of a fixed ferromagnetic layer, also called a spin polarising layer, an interlayer and a ferromagnetic excitable layer, which in the present invention is the excitable ferromagnetic layer 202. As the ferromagnetic excitable layer 202 has a specific separate function, in the present application it is considered not to be a part of the means for providing a current of spin polarised charge carriers 204, for clarity reasons. Trilayers are well known by the person skilled in the art. In an embodiment wherein the means for providing a current of spin polarized charge carriers 204 as e.g. shown in FIG. 5, the interlayer 210 may be a thin non-ferromagnetic metal such as Cu, a thin isolating tunnel barrier such as $Al_2O_3$ or MgO or a semiconducting non-ferromagnetic layer and should efficiently transfer the spin from the fixed layer 212 to the ferromagnetic excitable layer 202, also called the free layer. The fixed ferromagnetic layer 212 may be a thin ferromagnetic film of any alloy of Co, Fe, Ni, or another ferromagnetic metal or a semiconductor with ferromagnetic properties. A tuneable oscillator based on such a trilayer can be made e.g. by patterning a nanopillar in a multilayer stack or e.g. by electrodepositing a nanopillar in a template, or can be made e.g. by providing a nanocontact through a hole in an insulator 214, as shown in FIG. 5. The nanopillar or nanohole cross section can be circular, elliptical, rectangular or any other cross section. The diameter of the nanopillar or nanohole is typically small, e.g. between 5 and 500 nm, as to confine the current to a small volume to get a high spin torque efficiency with little power dissipation, which is related to the DC current amplitude. The trilayer may be fabricated with fixed layer closest to the substrate or with excitable layer closest to the substrate. The current typically is applied using a first and a second electrode 216. The means for interaction 206 with the ferromagnetic excitable layer as to select a frequency of the generated oscillations, or preferably as to tune a frequency of the generated oscillations may be applied in a large number of ways. Use may be made of a means for providing mechanical stress in the ferromagnetic excitable layer 202, exchange bias interactions with the ferromagnetic excitable 202 layer, magnetostatic interactions with the ferromagnetic excitable layer 202. Several specific examples will be described in further embodiments, although the invention is not limited thereto. By way of example, in FIG. 5 an interacting layer 218 e.g. generating stress or inducing magnetostatic or exchange bias interactions is provided in FIG. 5. Possible additional means for differing the amount of generated stress, the amount of induced magnetostatic interactions or the amount of exchange bias interactions are not illustrated. The selecting or tuning of the frequency of the generated oscillations may be performed with respect to a maximum oscillation frequency, although the invention is not limited thereto.

Additional layers may be added to the device in the ferromagnetic excitable layer 202 or the ferromagnetic fixed layer 212 or at the interface with the interlayer 218 to provide a higher magnetoresistive effect and thus a high output power for the oscillator for lower critical currents. The addition of layers to increase the magnetoresistance follows the ideas and concepts that have often been used in the magnetic recording industry to increase the magnetoresistive signal of a recording head. Such a recording head is typically a spin valve or a magnetic tunnel junction. They consist basically of a trilayer, ferromagnetic free layer, interlayer, ferromagnetic fixed layer, where the magnetoresistive signal originates from the spin-dependent scattering or spin-dependent tunnelling of the read current, and is strongly dependent on the angle between the fixed and the free layer. Examples of additional layers are materials with high polarisation of charge carriers added at the interfaces of the ferromagnetic layers and the interlayer to increase magnetoresistance, adding very thin layers, such as nano-oxyde layers to reflect spin currents thereby increasing the degree of spin polarisation.

Additional layers may also be added to pin the fixed layer while not creating unwanted magnetostatic couplings to the free or excitable layer. A typical method used in the recording industry to provide the pinning is to bring the fixed layer into contact with anti-ferromagnetic layer such as FeMn, and IrMn, and due to a magnetic interface interaction called exchange bias the hysteresis loop of the fixed layer is shifted towards higher fields. Exchange bias is a phenomenon that results because the spins of the ferromagnetic and anti-ferromagnetic material at the interface have to aligned in a compatible way. The fixed layer may also consist of a synthetic ferromagnetically coupled trilayer, consisting of two ferromagnetic layer that are separated by a second interlayer, being a non magnetic layer. The interlayer separates the fixed layer into two fixed layers of opposite magnetisation that form an almost closed magnetic path and therefore result in suppression of the unwanted magneto-static stray-fields. The stack of layers then e.g. comprises a free ferromagnetic layer/a non magnetic layer/a fixed ferromagnetic layer/a non magnetic layer/a fixed ferromagnetic layer/and an anti-ferromagnetic layer.

Furthermore, other layers could be added to further increase the amount of spin filtering, e.g. mirroring the structure to create a so called double spin filter with a excitable layer sandwiched between both. Such layers are known from e.g. US 2004/0208053. Any extra layers can be added known to a person of ordinary skill in the art.

The generation of a current of spin polarised charge carriers will now be discussed in more detail, by way of example for an embodiment wherein the means for providing a current of spin polarised charge carriers 204 into the ferromagnetic excitable layer 202 comprises a trilayer. It is to be noted that the invention is not limited thereto. In general a means for providing a current of spin polarised charge carriers 204 may be a means wherein a current is sent through a ferromagnetic material. The trilayer, consists of an excitable ferromagnetic layer 202, an interlayer 210 and a fixed ferromagnetic layer 212 with layer thickness of about 0.5-500 nm for each layer, where the free or excitable ferromagnetic layer 202 is typically thinner or has a lower magnetisation or a lower damping parameter of magnetic motion than the fixed ferromagnetic layer 212, such that the precessional motions induced by the current is larger in the excitable ferromagnetic layer 202 than in the fixed ferromagnetic layer 212. The fixed ferromagnetic layer 212 acts then as a spin filter of the current sent through it, and the spin-polarized current can then create a stable precessional oscillation in the excitable layer. The current in the oscillator is typically confined to a small region to have a high enough current density and high enough spin torque to create a considerable oscillation amplitude.

The precessional motion of the ferromagnetic excitable layer 202 that is driven by the spin-polarized DC current is typically translated into an AC voltage because of the magnetoresistance present in the trilayer. The precessional motion of the ferromagnetic excitable layer 202 results in a varying angle between the magnetisation orientation of the excitable layer and the magnetisation orientation of the fixed layer and therefore, due to spin-dependent scattering or spin-dependent tunnelling of the DC current, a magnetoresistive output signal at the frequency of the precessional motion of the ferromagnetic excitable layer 202 results. The frequency is typically close to the ferromagnetic resonance frequency of the ferromagnetic excitable layer 202 and can be between 0.5 and 10 GHz depending on the materials used and the value of the external bias field.

In a second embodiment of the present invention, the present invention relates to a device as described in the first embodiment, wherein the means for interaction 206 with the ferromagnetic excitable layer as to select/tune a frequency of the generated oscillations is a means that can set the frequency by biasing the ferromagnetic excitable layer. See FIGS. 6a, 6b and 6c. The biasing can be provided by bringing the ferromagnetic excitable layer in physical contact or in partial physical contact with an interacting layer which is an anti-ferromagnetic layer 222, as shown in the device 220 in FIG. 6a. Through the exchange bias effect, which is a phenomenon that results because the spins of the ferromagnetic and anti-ferromagnetic material at the interface have to aligned in a compatible way, the hysteresis loop of the ferromagnetic excitable layer 202 will shift to higher external bias fields, such that a smaller or no external bias field is needed anymore to bias to set the frequency and to reach the high quality factors obtained before by using an external magnetic bias field. The anti-ferromagnetic material may be a metal e.g. IrMn, FeMn . . . or an isolator e.g. Cr02. If the anti-ferromagnetic material is metallic, it may be part of the stack that is traversed by the current and the Joule heating by the current may reduce the exchange bias field, because the exchange bias field is strongly temperature dependent. The anti-ferromagnetic material may also be in physical contact with the excitable layer without being a part of the stack traversed by the current. In that case the anti-ferromagnetic material may also be the isolator 214 that is used for the definition of the nanohole. See FIG. 6b.

Figure 6A:
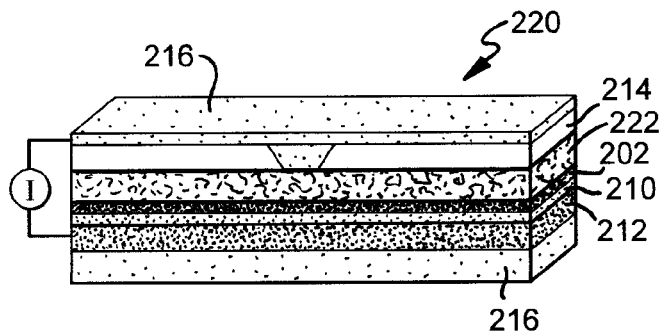
FIG. 6*a* to FIG. 6*c* shows a schematic representation of an integrated structure for an electronic device for generating oscillation with a selectable frequency based on biasing of the magnetic excitable layer according to the second embodiment of the present invention.
Figure 6B:
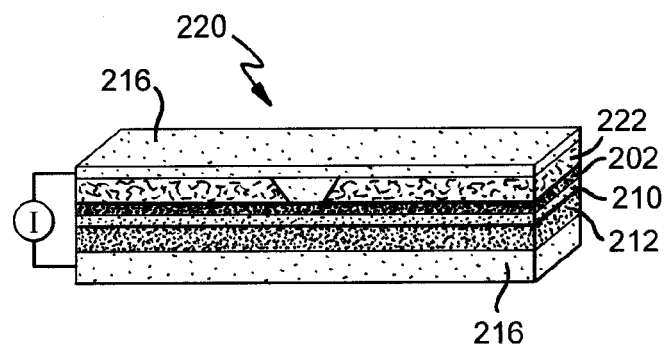
Figure 6C:
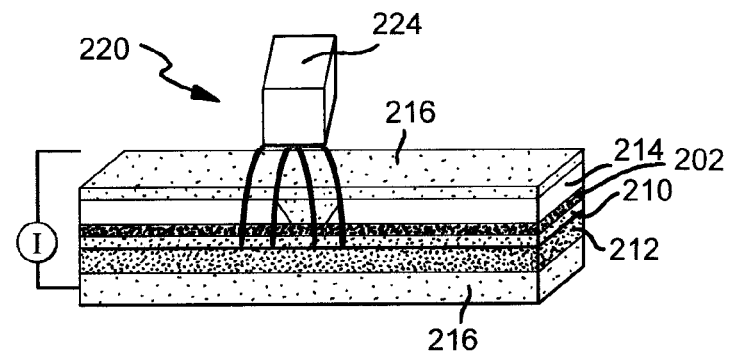

The biasing can also be provided by an additional ferromagnetic material 224 that is part of the device and that is magnetostatically coupled (in magnetic contact) to the ferromagnetic excitable layer 202. See FIG. 6c. The additional ferromagnetic material 224 does not have to be, but can be, in physical contact with the ferromagnetic excitable layer but has to be close enough to the ferromagnetic excitable layer 202 as to provide magnetic flux generated by the additional ferromagnetic material 224 to penetrate the ferromagnetic excitable layer 202, as shown in FIGS. 6a and 6b. The additional ferromagnetic material 224 may be lying under or next to the current induced oscillator. The additional ferromagnetic material 224 may also be the isolator that is used for the definition of a nanohole.

Figure 7:
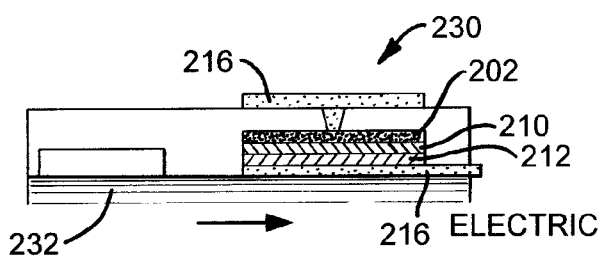
FIG. 7 to FIG. 10*b* are schematic representation of different alternative configurations for an integrated structure for an electronic device for generating oscillation with a tunable frequency, said tuning being based on generating stress in piezoelectric material, according to a third embodiment of the present invention.
Figure 8A:
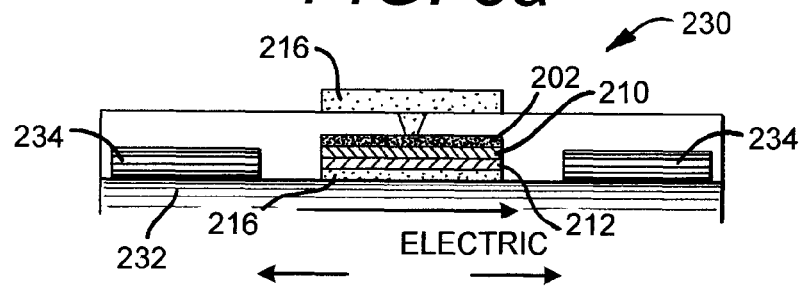
FIG. 8*c* thereby illustrates the stress dependence of an antiferromagnetic material e.g. in the embodiments shown in FIG. 8*a* and FIG. 8*b*.
Figure 8B:
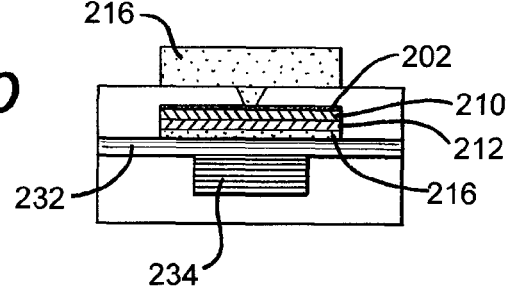
Figure 8C:
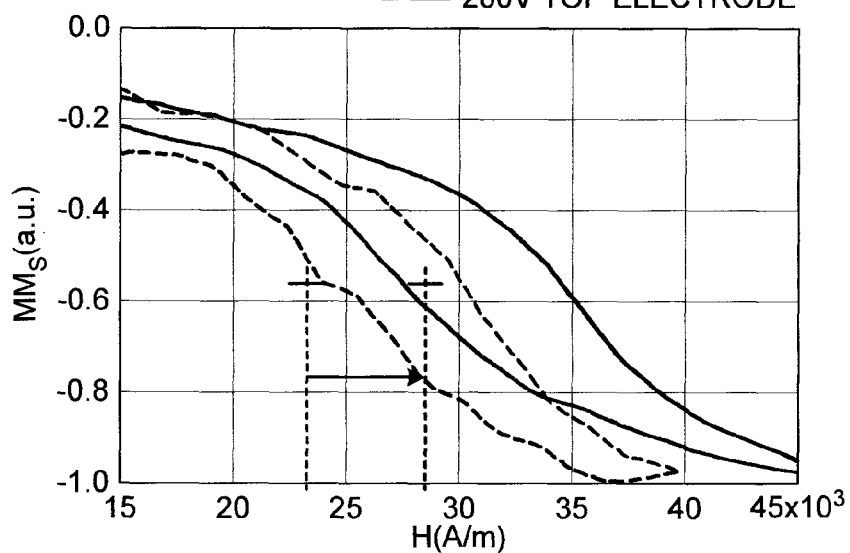
Figure 9:
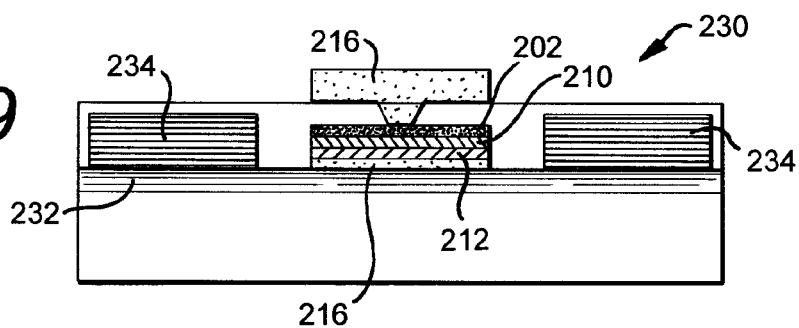
Figure 10A:
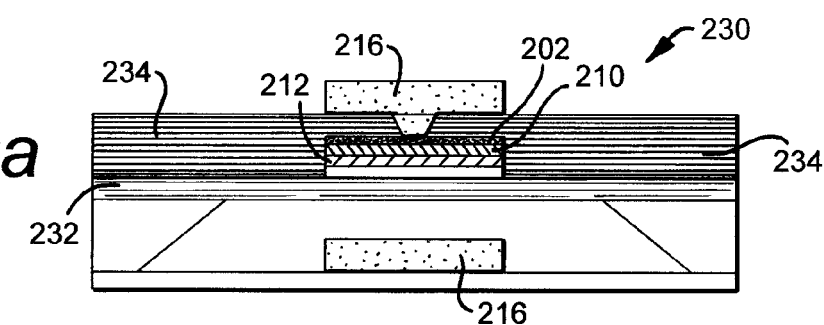
Figure 10B:
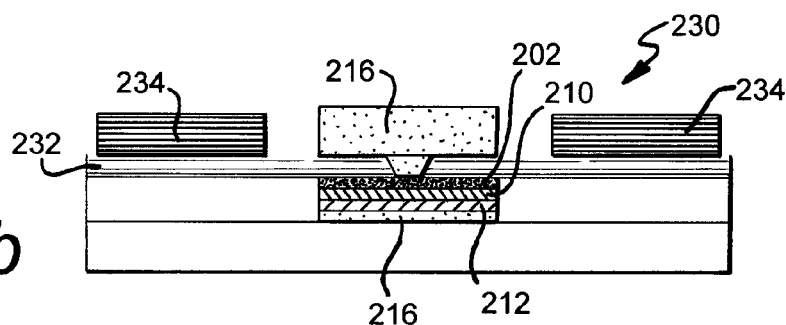

In a third embodiment of the present invention, the invention relates to a device as described in any of the previous embodiments, wherein the means for interaction 206 with the ferromagnetic excitable layer as to select/tune a frequency of the generated oscillations is a means that allows to controllably tune the frequency of the generated oscillations. This may happen by direct interaction with the excitable layer as to change its magnetic properties. The means that interact with the excitable layer may e.g. comprise a piezoelectric material, as indicated in the device 230 of FIG. 7 and FIG. 8. The piezo-electric layer 232 can be in contact or not in contact with the ferromagnetic excitable layer 202, and when subject to an electrical field, the piezo-electric material 232 will apply a stress on the piezo-electric layer 232 as well as on the ferromagnetic excitable layer 202. The magnetic properties of the ferromagnetic excitable layer, i.e. the magnetic anisotropy and the gyromagnetic precession ratio or the Lande g-factor, and the magnetic damping parameter or Gilbert damping parameter, can be changed due to the applied stress via magneto-elastic coupling. The change of magnetic properties results in a change of the oscillation frequency and the quality factor of the oscillation. The present invention can therefore be used to tune the frequency of the oscillator in a controlled way by setting the value of the stress by selecting the electrical field on the piezoelectric material 232. One or more additional electrodes 234 may be provided to apply the electrical field that generates the stress, on the piezoelectric material 232. These additional electrodes 234 may be located symmetrically around the oscillator to apply a potential difference between the electrodes, leaving the oscillator at a potential in between the potential of the electrodes, or to apply a potential difference between the electrodes 234 and a contact to the oscillator. The piezoelectric material may also be located between the oscillator and a bottom contact, such that the piezoelectric material is operating in the so called $d_{31}$ operation regime, where the electric field is applied on the material in its thickness direction and the stress/strain can be along the length and width directions. The latter is illustrated in FIG. 8b. An example of the induced exchange bias field illustrating the stress dependence of an anti ferromagnetic material is shown in FIG. 8c. The piezoelectric material 232 may be a piezoelectric substrate, a piezoelectric thin film layer or multilayer deposited on top of a substrate, as shown in FIG. 9, a piezoelectric membrane or suspended structure with electrodes to stress the layer, as shown in FIG. 10a, and may through magneto-elastic interaction change the properties of the ferromagnetic excitable layer 202 thereby changing the oscillator frequency. The piezoelectric material 232 and the ferromagnetic excitable layer 202 may be in direct contact. The piezoelectric material 232 may be the isolator in which the nanohole is patterned, as shown e.g. in FIG. 10b. The piezoelectric material 232 and the ferromagnetic excitable layer may also be one and the same material that are piezoelectric and ferromagnetic at the same time, such as is the case in a class of materials named multiferroics.

Figure 11A:
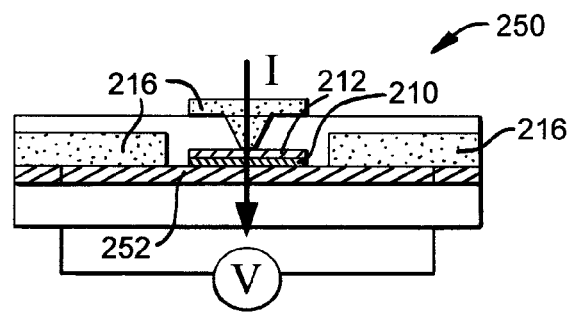
FIG. 11*a* and FIG. 11*b* are schematic represenations of an integrated structure for an electronic device for generating oscillation with a tunable frequency, said tuning being based on electrically influencing a ferromagnetic semiconductor layer
Figure 11B:
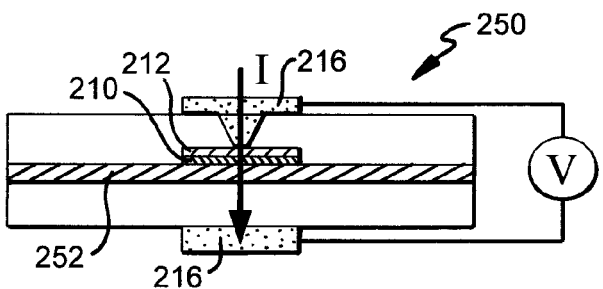

In a fourth embodiment, the present invention relates to a device as described in any of the previous embodiments, wherein the ferromagnetic excitable layer comprises a magnetic semiconductor. Two possible configuration 250 are shown in FIG. 11a and FIG. 11b. In this embodiment, the application of an electrical field to the semiconductor ferromagnetic excitable layer 252 influences the magnetic properties using the electrical properties of the semiconductor ferromagnetic excitable layer 252. In such a magnetic semiconductor such as Mn doped GaAs, a large interplay exists between the electrical and magnetic properties. The interaction of the electrical field with the magnetic semiconductor 252 can create a reordering of spin carrying charges that may change the magnetic properties of the excitable layer locally or over the whole layer such that the frequency of the oscillation is tuneable by the electrical field.

In a fifth embodiment, the present invention relates to a device as described in any of the previous embodiments, wherein the means of magneto-elastic interaction with the ferromagnetic excitable layer 202 consisting of a suspended structure that is actuated not by the electric field and the piezoelectric effect but by another physical force, such as electrostatic, i.e. capacitive, actuation by a potential difference over a capacitor in which the suspended structure forms one of its electrodes. The electric device then may have a similar structure as the one shown in FIG. 10. The present invention may also relate to any interaction layer that can interact magneto-elastically with the excitable layer by generating a stress in said interaction layer. The interaction layer may consists of a suspended structure that can be actuated by a physical force such as temperature, laser light, mechanical force or by pressure build up.

Figure 12:
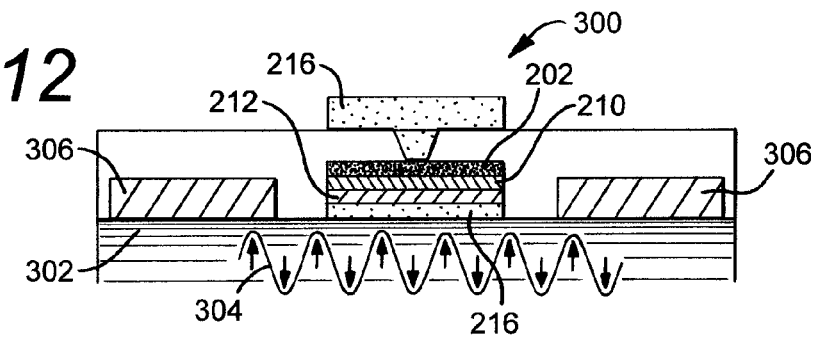
FIG. 12 is a schematic representation of an integrated structure for an electronic device for generating oscillation with a tunable frequency, said tuning being based on generation of stress by introducing a surface acoustic wave, according to the sixth embodiment of the present invention.

In a sixth embodiment, the present invention relates to a device comprising similar features as described in the previous embodiments, but wherein the means for tuning comprises a piezoelectric layer and a surface acoustic wave generator for generating a surface acoustic wave (SAW). In this embodiment magneto-elastic energy conversion occurs between a surface acoustic wave (SAW) in the piezoelectric layer and the excitable layer of the oscillator is present, as shown in the device 300 of FIG. 12. The piezoelectric layer 302 acts as the transport layer for the surface acoustic wave 304, generated by at least one surface acoustic wave generating means 306. The latter may e.g. be an interdigited electrode. The surface acoustic wave generating means 306 is adjusted to generate in the transport layer a surface acoustic wave 304 having a wavelength $\lambda_{SAW}$ and having a frequency $\nu_{SAW}$. The frequency $\nu_{SAW}$ should be close to the peak frequency of the current-induced oscillation (or an integer multiple thereof) such that both frequencies can lock to each other. Since the oscillator is typically of nano-scale dimensions, the wavelength of the SAW $\lambda_{SAW}$ will be larger than the dimensions of the active part of the oscillator (e.g. the diameter of the nanohole). The interaction of the SAW 304 with the ferromagnetic excitable layer 202 will therefore be quite uniform over the oscillator and entirely depend on the frequency, phase difference and amplitude of the SAW 304 with respect to the peak frequency of the oscillator. The transport layer comprises piezoelectric material 302, and the ferromagnetic element may be in direct contact with the transport layer or with the surface acoustic wave generating means 306. The frequency of the surface acoustic waves may be chosen in a narrow frequency range around the ferromagnetic resonance frequency or multiple thereof. The oscillation peak is preferably as narrow as possible, as is represented by a high quality factor Q. The frequency range preferably used may then be the range with a width corresponding to a certain fraction of the width of the oscillation peak. This fraction may for example be 200%, 150%, 100%, 50%, 25%, 10%, 2% or 1%.

Figure 13A:
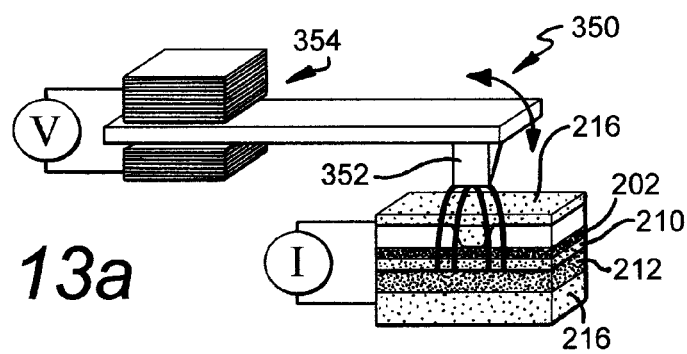
FIG. 13*a* and FIG. 13*b* are schematic representations of an integrated structure for an electronic device for generating oscillation with a tunable frequency, said tuning being based on changing the magnetostatic coupling, according to the seventh embodiment of the present invention.
Figure 13B:
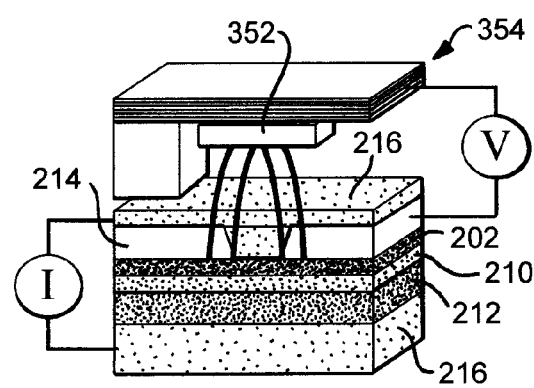

In a seventh embodiment, the invention relates to a device as described in the previous embodiments, particularly embodiment 2, but allowing to controllably tune and reversibly alter the frequency of the generated oscillation by indirect interaction with the excitable layer through the means for generating the magnetic bias field. The means that is used to tune the frequency may comprise a piezoelectric material or suspended structure that can apply a stress upon e.g. an antiferromagnetic element, e.g. layer, that is in contact with the excitable layer in a controlled way. The piezo-electric layer can be in direct contact or not in direct contact with antiferromagnetic element, and when subject to an electrical field, the piezo-electric material will apply a stress on the piezo-electric layer as well as on the anti-ferromagnetic element. The exchange bias field in a spin valve thus can be altered by the application of stress. Since the exchange bias field in the present invention is used to bias the ferromagnetic excitable layer 202, a change of the exchange bias field on application of stress will also alter the frequency of the oscillator. The means that is used to alter the frequency may also change the magneto-static coupling between an additional ferromagnetic element 352 and the ferromagnetic excitable layer 202. The means that is used to change the magnetostatic coupling may comprise a means 354, such as e.g. a piezoelectric material or suspended structure, that can change the geometric distances between the additional ferromagnetic element 352 and the ferromagnetic excitable layer 202 and can therefore change the magnetostatic coupling. A schematic illustration of this embodiment is shown in FIG. 13a and FIG. 13b. Since the magnetostatic coupling provides the bias field, it sets the frequency of the oscillation in the ferromagnetic excitable layer 202, the frequency can be tuned by altering the magnetostatic coupling.

Figure 14A:
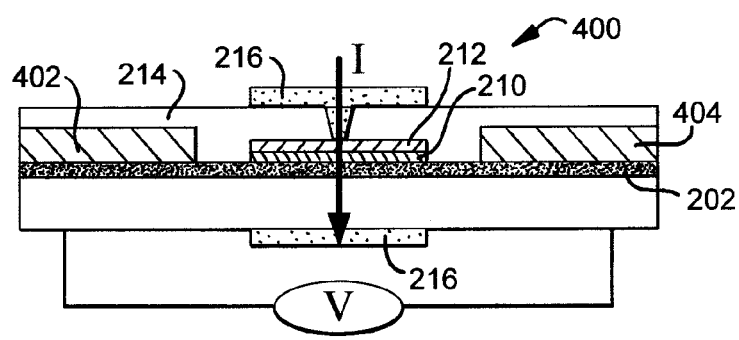
FIG. 14*a* to FIG. 14*b* is a schematic representation of a device allowing a first alternative read out based on measuring a lateral resistance according to a further embodiment of the present invention.
Figure 14B:
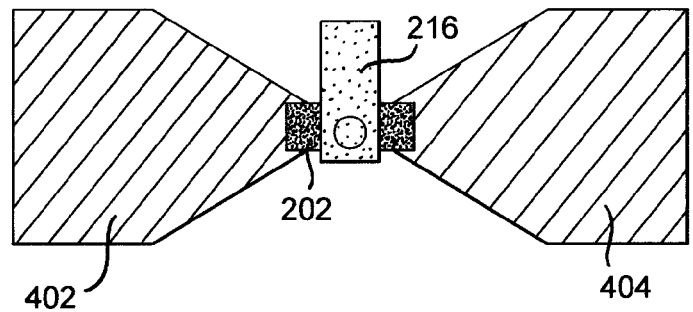
Figure 14C:
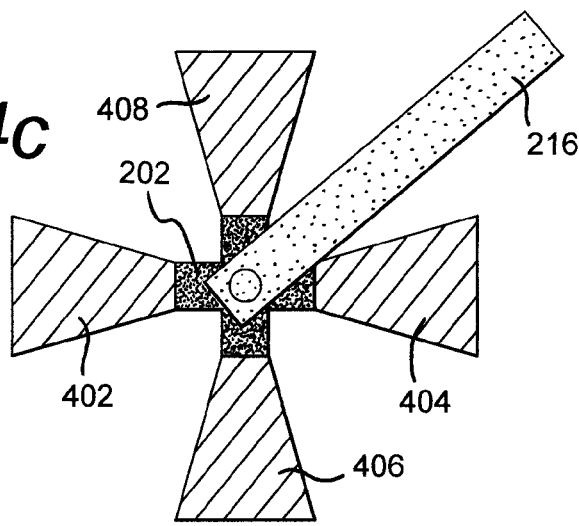
* and FIG. 14*c* illustrates a top view for two different alternatives

In a further embodiment of the present invention, the invention furthermore relates to a method for reading out a device generating oscillations as described in the above described embodiments of the present invention. In the state-of-the-art, the magnetoresistance that is present between the ferromagnetic excitable layer and the ferromagnetic fixed layer and the variations of this magnetoresistance due to the precessional motions of the excitable layer is responsible for the AC voltage at the output and thus is used as a reading out of the device. The present invention also relates to an alternative read out where the precessional motion that is excited by the spin polarised current changes another measurable parameter. The other measurable parameter may be for example a change of the resistance or voltage in a lateral geometry. Possible physical effects at the origin of a lateral resistance change can be e.g. the anisotropic magnetoresistance of the ferromagnetic excitable layer that is dependent on the direction of the magnetisation of the ferromagnetic excitable layer with respect to the direction of the current through the layer. Another example of a measurable parameter is the extraordinary Hall effect that is a measure of the magnetisation component orthogonal to the bias field and the current sent through the excitable layer. The lateral resistance change can be measured as an AC signal between at least two read out electrodes 402, 404 that are in electrical contact with the ferromagnetic excitable layer 202, as illustrated in FIG. 14a The electrodes for providing the current of spin polarised charge carriers are also shown in FIG. 14a. A top view is also provided for a system with two read out electrodes 402, 404 in FIG. 14b and for four read out electrodes 402, 404, 406, 408 in FIG. 14c.

Figure 15:
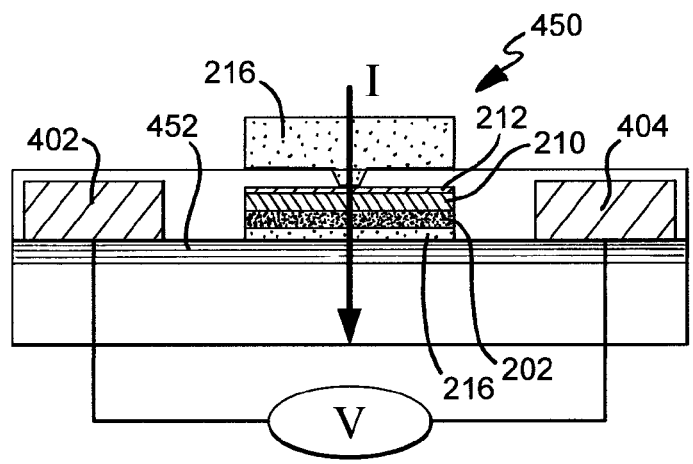
FIG. 15 is a schematic representation of a device allowing another alternative read out based on measuring an electrical signal in a piezoelectric layer created by the precessional motion in the magnetic excitable layer, according to a further embodiment of the present invention.

The alternative read out may further comprise an interlayer such as a piezoelectric material that converts the precessional motion of the excitable layer into an electrical signal by using the magnetoelastic coupling between the ferromagnetic excitable layer 202 and a piezoelectric layer 452. The latter is illustrated for device 450 in FIG. 15. It will be obvious to the person skilled in the art that other readout systems based on measurable parameters such as material properties, differing from the magnetisation, used to read-out the devices as described above, are within the scope of the present invention.

Other arrangements for accomplishing the objectives of the device for generating a tunable oscillating signal embodying the invention will be obvious for those skilled in the art.

It is to be understood that although preferred embodiments, specific constructions and configurations, as well as materials, have been discussed herein for devices according to the present invention, various changes or modifications in form and detail may be made without departing from the scope and spirit of this invention.

The invention claimed is:

1. A device for generating an oscillating signal, the device comprising:
   means for providing a current of spin polarized charge carriers;
   a magnetic excitable layer adapted for receiving said current of spin polarized charge carriers thus generating an oscillating signal with a frequency $v_{osc}$; and
   an integrated means, different from said means for providing a current of spin polarized charge carriers, for interacting with said magnetic excitable layer to thereby select said oscillation frequency, wherein said interacting comprises performing magnetic interactions comprising inducing mechanical stress in said magnetic excitable layer.

2. A device according to claim 1, wherein said integrated means for interacting with said magnetic excitable layer is a means for controllable tunable interacting with said magnetic excitable layer such that a controllable tuning of said oscillation frequency is achieved.

3. A device according to claim 1, wherein said magnetic interactions are interface interactions.

4. A device according to claim 1, wherein said interacting comprises performing any of magnetostatic interactions and exchange bias interactions.

5. A device according to claim 1, wherein said magnetic excitable layer is a ferromagnetic semiconductor layer and said interacting comprises applying an electric field over said ferromagnetic semiconductor layer.

6. A device according to claim 1, comprising a means for generating a magnetic bias field to bias the magnetic excitable layer.

7. A device according to claim 6, wherein said means for generating a magnetic bias field is an antiferromagnetic layer which is in at least partial magnetic contact with said magnetic excitable layer.

8. A device according to claim 7, comprising a means for generating stress upon said antiferromagnetic layer.

9. A device according to claim 6, wherein said means for generating said magnetic bias field comprises an element of ferromagnetic material that is magnetostatically coupled to said magnetic excitable layer.

10. A device according to claim 9, further comprising a means for changing the geometric distances between said magnetic excitable layer and said ferromagnetic element.

11. A device according to claim 10, wherein said means for changing the geometric distances consists of one of a piezoelectric layer and a suspended structure.

12. A device according to claim 1, wherein said integrated means for interacting with said magnetic excitable layer comprises an interacting layer that is coupled via one of magneto-elastically, magneto-statically and exchange bias effect to said magnetic excitable layer.

13. A device according to claim 12, wherein said interacting layer is a piezoelectric layer.

14. A device according to claim 12, wherein said interacting layer is an antiferromagnetic layer.

15. A device according to claim 12, further comprising a surface acoustic wave generating means that can generate a Surface Acoustic Wave in said interacting layer.

16. A device according to claim 15, wherein said interacting layer is a structural part of the Surface Acoustic Wave generating means.

17. A device according to claim 15, wherein said surface acoustic wave generating means generates a Surface Acoustic Wave in said interacting layer that has a frequency essentially equal to a magnetic resonance frequency of said excitable layer, or an integer multiple thereof.

18. A device according to claim 12, wherein at least two electrodes are provided on one of a surface and an inside of said interaction layer, which induces stress in said interaction layer by putting an electrical potential difference over them.

19. A device according to claim 12, comprising a means for generating stress in said interaction layer by one of physical force and pressure build up.

20. A device according to claim 1, wherein said means for providing a current of spin polarized charge carriers is abutting on said magnetic excitable layer and comprises an electrode, a spin polarization means and a current confinement structure.

21. A device according to claim 20, wherein said means for providing a current of spin polarized charge carriers comprises a fixed layer with a constant magnetic polarization through which the current is passing, before entering into the excitable layer.

22. A device according to claim 21, wherein the fixed layer and excitable layer are separated by an interlayer to magnetically separate both layers.

23. A device according to claim 1, further comprising a readout structure that measures excitation caused by the spin polarized current passing through said magnetic excitable layer.

24. A device according to claim 1, further comprising a readout structure that measures magneto-resistance generated by a combination of the fixed layer and the magnetic excitable layer.

25. A device according to claim 1, further comprising a readout structure that comprises a piezoelectric measurement layer that converts precessional movement of the excitable layer into an electrical signal.

26. A device according to claim 1, further comprising a readout structure that measures resistance change by measuring an AC signal between at least two electrodes in electrical contact with said excitable layer.

27. A device according to claim 1, further comprising a readout structure that measures change of one of resistance and voltage in a lateral geometry.

28. A method for generating oscillations, the method comprising;
    providing a current of spin polarized charge carriers, thus generating an oscillating signal with an oscillation frequency $v_{osc}$ by interaction between said current of spin polarized charge carriers and a magnetic excitable layer; and
    controllably tuning said oscillation frequency $v_{osc}$ by inducing an interaction between an integrated means, different from said means for providing a current of spin polarized charge carriers, and said magnetic excitable layer, wherein said interaction comprises performing magnetic interactions comprising inducing mechanical stress in said magnetic excitable layer.

29. A method according to claim 28, wherein inducing an interaction between an integrated means and said magnetic excitable layer comprises any of inducing mechanical stress in said magnetic excitable layer, inducing exchange bias interactions and inducing magneto static interactions.

30. A method according to claim 28, said magnetic excitable layer being a ferromagnetic semiconductor layer, wherein inducing an interaction is performed by applying an electric field over said ferromagnetic semiconductor layer.

31. A method for reading out a magnetic element, the method comprising:
    providing a current of spin polarized charge carriers, thus generating an oscillating signal with an oscillation frequency $v_{osc}$ by interaction between said current of spin polarized charge carriers and a magnetic excitable layer;
    controllable tuning said oscillation frequency $v_{osc}$ by inducing an interaction between an integrated means, different from said means for providing a current of spin polarized charge carriers, and said magnetic excitable layer, wherein said interaction comprises performing magnetic interactions comprising inducing mechanical stress in said magnetic excitable layer; and
    measuring an excitation caused by said spin polarized charge carriers.

\* \* \* \* \*